United States Patent [19]

Sakai et al.

[11] 4,377,819
[45] Mar. 22, 1983

[54] SEMICONDUCTOR DEVICE

[75] Inventors: Yoshio Sakai; Toshiaki Masuhara, both of Hachioji; Osamu Minato, Kokubunji; Toshio Sasaki, Hachioji; Hisao Katto, Hinodemachi; Norikazu Hashimoto, Tokorozawa; Shin-ichi Muramatsu, Hachioji; Akihiro Tomozawa, Hinodemachi, all of Japan

[73] Assignee: Hitachi, Ltd., Tokyo, Japan

[21] Appl. No.: 32,017

[22] Filed: Apr. 20, 1979

[30] Foreign Application Priority Data

Apr. 24, 1978 [JP] Japan ................................. 53-47779

[51] Int. Cl.³ .......................................... H01L 29/04
[52] U.S. Cl. ...................................... 357/59; 357/49; 357/51; 357/53; 357/54; 357/23
[58] Field of Search ...................... 357/51, 49, 59, 41, 357/23, 23 R, 23 CS, 54, 53

[56] References Cited

U.S. PATENT DOCUMENTS

| 3,518,494 | 6/1970 | James | 357/53 X |
| 3,597,667 | 8/1971 | Horn | 357/54 |
| 4,110,776 | 8/1978 | Rao | 357/51 X |

Primary Examiner—Martin H. Edlow
Attorney, Agent, or Firm—Antonelli, Terry & Wands

[57] ABSTRACT

A semiconductor device including at least a resistance element formed of polycrystalline silicon having a high resistivity. An electrode is provided on the high resistance polycrystalline silicon region with a silicon dioxide film and a silicon nitride film being interposed therebetween. The electrode is coupled to the ground potential. In this manner, high stability is obtained in the behavior of the resistance element inasmuch as the formation of a parasitic MOS device under said high resistance region is suppressed, and the threshold voltage of any such MOS device is made raised.

8 Claims, 39 Drawing Figures

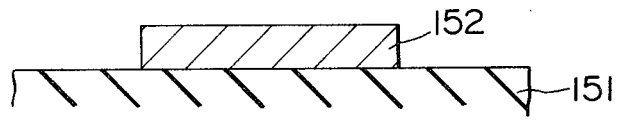
FIG. 15A
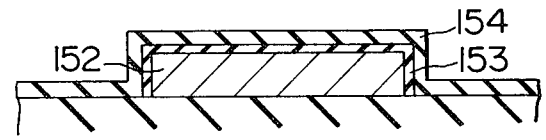
FIG. 15B
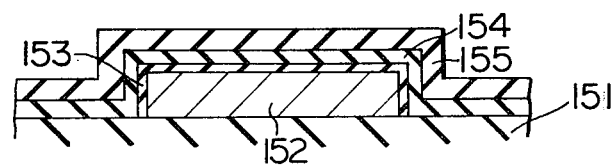
FIG. 15C
FIG. 15D  FIG. 15G
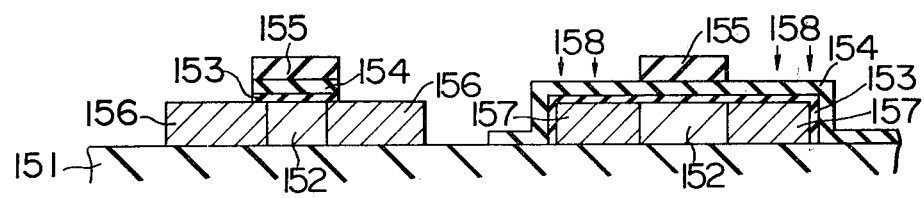
FIG. 15E  FIG. 15H
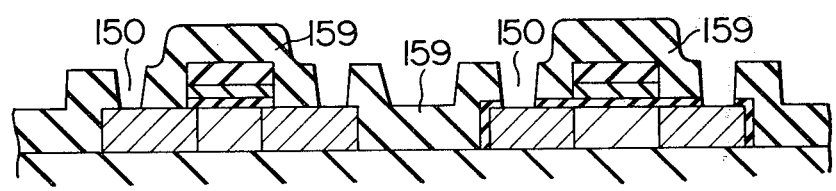
FIG. 15F  FIG. 15I
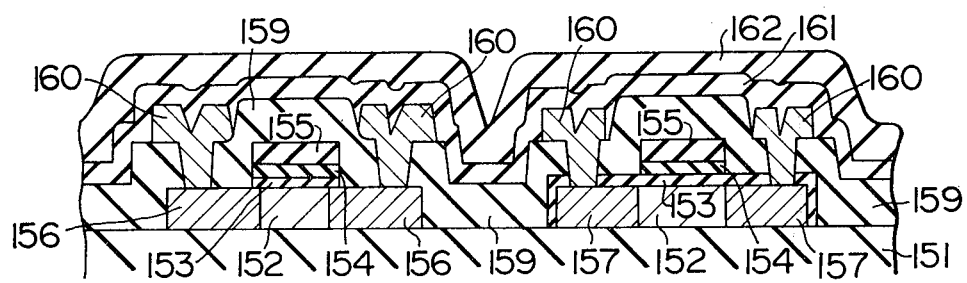

SEMICONDUCTOR DEVICE

BACKGROUND OF THE INVENTION

1. Field of the Invention

The present invention relates in general to a semiconductor device and in particular to a resistance element formed of polycrystalline silicon and used in semiconductor integrated circuits or the like.

2. Description of the Prior Art

In static memory integrated circuits, for example, a resistance element is formed of polycrystalline silicon.

In the case of a static memory cell shown in FIG. 1, load resistances R1 and R2 formed of polycrystalline silicon (hereinafter referred to as Poly Si in an abridgement) and exhibiting a high resistance not smaller than $10^8$ ohms ($\Omega$) are connected between a power supply source $V_{DD}$ and insulated gate field effect transistors (hereinafter referred to as MOS transistors) $T_{r1}$ and $T_{r2}$, respectively. Specifically, these resistances are achieved by using a wiring 21 formed of Poly Si which is divided into a high resistance part 22 realized by low impurity ion implantation and a low resistance part 23 realized by high impurity diffusion or the like process, as can be seen from FIGS. 2 and 3 which show a wiring conductor in a plan view and a sectional view, respectively. In FIG. 3, reference numeral 31 denotes a silicon dioxide ($SiO_2$) film, 32 denotes a phospho silicate glass (PSG) film and 33 denotes a silicon (Si) substrate. The resistance value of polycrystalline silicon or Poly Si resistance elements can be controlled to a desired value in a range of $10^5 \Omega$ to $10^{12} \Omega$, for example, which value is controllably determined by the impurity dose implanted through the ion implantation. Leakage current through the MOS transistors $T_{r1}$ and $T_{r2}$ is compensated by a small current flowing through the high resistance Poly Si element 22, whereby information is held as stored in the memory cell. Accordingly, it is very important to control the small current flowing through the high resistance Poly Si element. In FIG. 1, numeral 11 denotes a word line, and 12 denotes a data line.

The Poly Si resistance element suffers from a drawback that the resistance value thereof is undesirably decreased when the resistance element undergoes treatments such as formation of protection films for interconnection layers in succession to the formation of aluminium (Al) metallization layers and then subjected to thermal processes such as hydrogen annealing and cerdip (glass molding) at a temperature of about 450° C. By way of example, a curve 41 shown in FIG. 4 illustrates how the resistance value of Poly Si resistance element is decreased due to the hydrogen ($H_2$) annealing process. It should be noted, however, that the rate of decrease in the resistance value is usually so small that the resistance value will remain without departing appreciably from a standard value.

Recently, a development has been made in resin molding techniques involving the use of a $SiO_2$ film formed by a sputtering method and a silicon nitride (e.g., $Si_3N_4$) film formed by a plasma method (or glow discharge method) for the outer protection film for the interconnection layers. This development has been found to be preferable to the hitherto known silicon oxide film ($SiO_2$ or PSG film) which usually contains phosphorus (P). In such case, the Poly Si resistance element having a $Si_3N_4$ film deposited thereon will undergo a remarkable variation in the resistance value as illustrated by a curve 42 in FIG. 4 when subjected to the hydrogen annealing process. On the other hand, when a sputtered $SiO_2$ film is to be used, the resistance value of the Poly Si element will be decreased considerably immediately after the deposition of $SiO_2$ film. Such decrease in the resistance value can be compensated to some degree through the subsequent hydrogen annealing process as illustrated by a curve 43. However, restoration of the resistance to the desired value can not be attained.

It is believed that the Poly Si resistance element is susceptible to electrical damage due to plasma and likely to undergo variations in the electrical characteristic by reason of possible contamination of the $Si_3N_4$ film. Such variation in the electrical characteristic or property seems to be similar in genesis mechanism to the one observed usually in a conventional MOS transistor placed in a discharging plasma. However, it has been found that, in the case of the memory cell described above, the electrical characteristic such as the threshold voltage value of MOS transistors remains in the range of the standard value even after the hydrogen annealing process.

In the light of the foregoing, it is believed that the deposited Poly Si film will undergo variation in respect of the conductivity thereof due to undesirable fixed charges and surface states produced at the interface between the Poly Si film and an insulation film under the influence of plasma and contamination even in the degree which can be neglected in the case of MOS transistor formed in a single crystal substrate.

Referring to FIG. 5 which shows in a top plan view a pattern of a memory cell device corresponding to the one shown in FIG. 1 and including the Poly Si resistance element, numeral 50 denotes an Al metallization for earth connection, 51 and 52 denote data lines realized by Al metallization, 53 denotes a diffusion layer, 54 denotes a word line realized by a Poly Si interconnection layer, 55, 56 and 57 designate contacting parts, and 58, 59 and 60 denote low resistance interconnection layers formed of n+-conductivity type. Poly Si. As can be seen from the drawing, the Al metallization layer 51 serving as the data line extends over one (A in the illustrated structure) of two high resistance Poly Si layer parts A and B. A sectional view of the part A of the high resistance Poly Si layer as well as the adjacent regions is schematically shown in FIG. 6. Since the potential at the Al metallization layer 51 serving as the data line is increased to a level in approximation to the supply voltage level (e.g. 5 V), a channel will be formed to the high resistance Poly Si part A underlying the Al metallization layer 51 due to parasitic MOS (Metal-Oxide-Semiconductor) effect, thereby to increase remarkably the current flow in the high resistance Poly Si part A, which is of course undesirable from the view point of power dissipation. In FIG. 6, reference numeral 61 denotes a $SiO_2$ film, 62 a PSG film and 63 designates a substrate of Si.

FIG. 7 graphically illustrates variation in the small current flowing through the high resistance Poly Si layer described above as a function of a gate voltage at an Al gate electrode formed on the high resistance Poly Si layer with the interposition of a PSG film of about 0.8 $\mu$m in thickness. As can be seen from this figure, when the gate voltage at the Al gate electrode increases beyond a predetermined voltage (about 4 V in the example shown in FIG. 7), the current flowing through the high resistance Poly Si will increase, which can be explained by the fact that a channel is formed at the surface of the high resistance Poly Si layer underlying the PSG film due to the parasitic MOS effect under the influence of the gate potential at the Al gate electrode. Such parasitic MOS effect is of course disadvantageous in that the power dissipation in the memory cell is undesirably increased. Particularly, when a nitride film is additionally formed as an outer protection layer on the PSG film by a plasma deposition method, the level of the gate voltage at which the current flowing through the high resistance Poly Si layer begins to increase will tend to be lowered, whereby the use of the nitride film formed by the plasma deposition method is eventually rendered impractical.

The other part B of the high resistance Poly Si layer shown in FIG. 5 has no Al metallization layer extending thereon but is deposited directly only with a PSG film, as is illustrated in a sectional view shown in FIG. 8. However, when the nitride ($Si_3N_4$) film is formed over the Al metallization layer through the interposition of PSG film by a plasma method, the resistance value of the Poly Si part B underlying the $Si_3N_4$ film is decreased as in the case of the Poly Si part A described above, involving disadvantageously a correspondingly increased power dissipation.

SUMMARY OF THE INVENTION

Accordingly, it is a primary object of the present invention is to eliminate drawbacks of the hitherto known Poly Si resistance element described above.

Another object of the invention is to provide a semiconductor device including Poly Si resistance elements in a structure immune to leakage current due to parasitic MOS effect.

Still another object of the invention is to provide a semiconductor device incorporating therein Poly Si resistance which is essentially not susceptible to electrical damages and injuries during plasma and/or sputtering processes and which undergoes substantially no change in the electrical characteristics even when the silicon nitride film is deposited as the protection film.

In other words, the invention is to propose a novel structure of a semiconductor device including Poly Si resistance elements starting from the knowledge acquired in the course of examination of the hitherto known Poly Si resistances with an effort to find out the causality for the undesirable properties thereof.

In view of above and other objects which will become more apparent as description proceeds, there is proposed according to a general aspect of the invention a semiconductor device including resistance elements formed of polycrystalline silicon or Poly Si exhibiting a high resistance value, wherein an electrode of a metal or a semiconductor material is formed above the high resistance Poly Si region with an insulation layer interposed, and the electrode is coupled to the ground or earth potential.

BRIEF DESCRIPTION OF THE DRAWINGS

FIGS. 15A, 15B, 15C, 15D, 15E, 15F, 15G, 15H and 15I are sectional views to illustrate fabrication steps of the device according to the second embodiment of the invention.

DESCRIPTION OF THE PREFERRED EMBODIMENTS

Exemplary Embodiment 1

Figure 9:
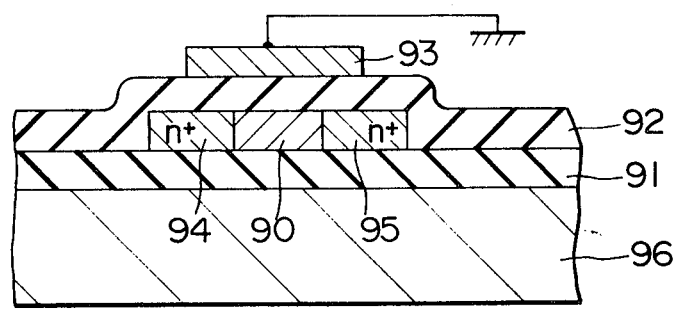
FIG. 9 is a sectional view showing a structure of a semiconductor device according to an embodiment of the invention.

Referring to FIG. 9, an Al electrode 93 is formed on a high resistance Poly Si layer 90 with a PSG film 92 being interposed therebetween. With such structure, when the Al electrode 93 is connected to the ground or earth potential, the parasitic MOS effect due to electrical noise can be effectively suppressed. Further, this structure allows a nitride film to be deposited by a plasma method so as to serve as a passivation or protection film. In FIG. 9, numeral 91 denotes a $SiO_2$ film, 94 and 95 denote low resistance Poly Si parts of $n^+$-type conductivity, and 96 denotes a Si substrate.

Figure 1:
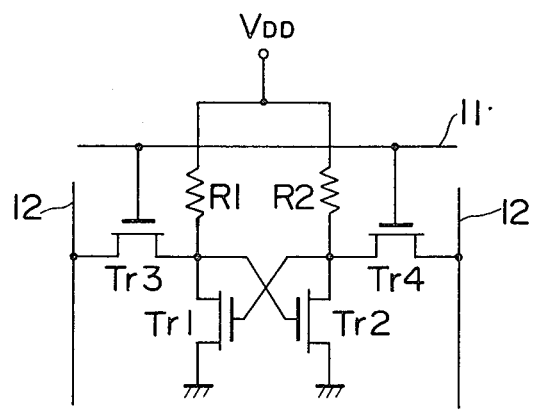
FIG. 1 is a circuit diagram showing a circuit arrangement of a static memory cell.
Figure 2:
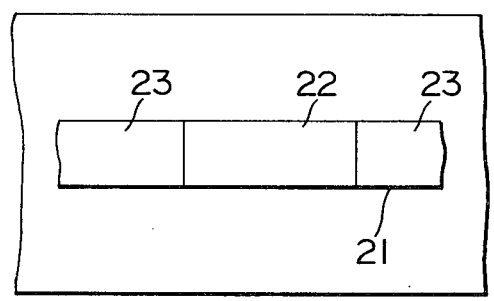
FIG. 2 is a top plan view to illustrate a pattern of a polycrystalline silicon or Poly Si resistance element.
Figure 3:
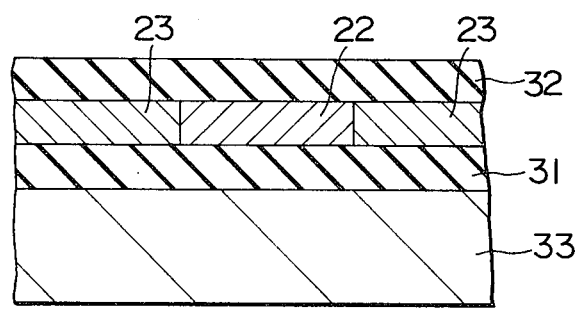
FIG. 3 is a sectional view showing a Poly Si resistance layer together with associated regions.
Figure 4:
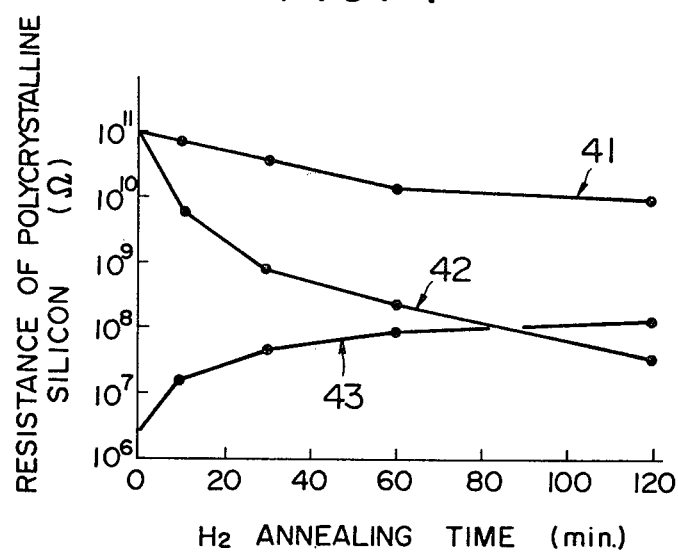
FIG. 4 graphically illustrates variation in resistance value of a Poly Si resistance element brought about after various thermal processes.
Figure 5:
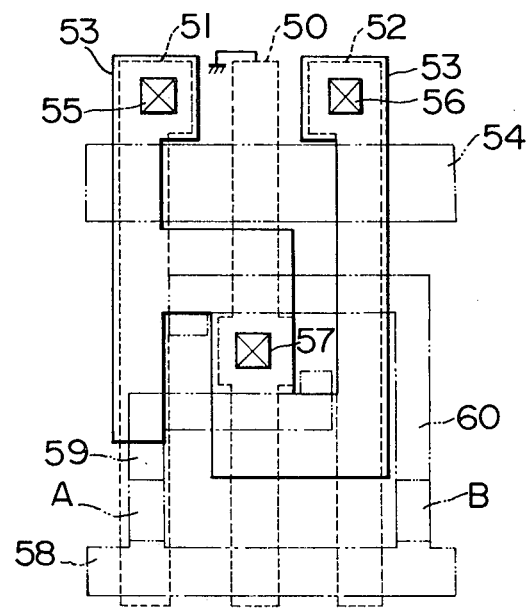
FIG. 5 shows in a top plan view a structural pattern of the memory cell shown in FIG. 1 and implemented as a semiconductor device.
Figure 6:
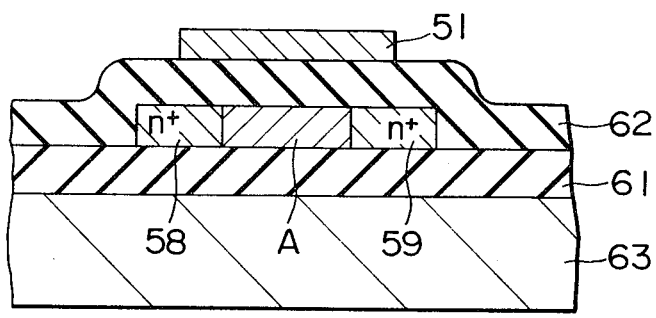
FIG. 6 shows a sectional view of a resistance part A shown in FIG. 5.
Figure 7:
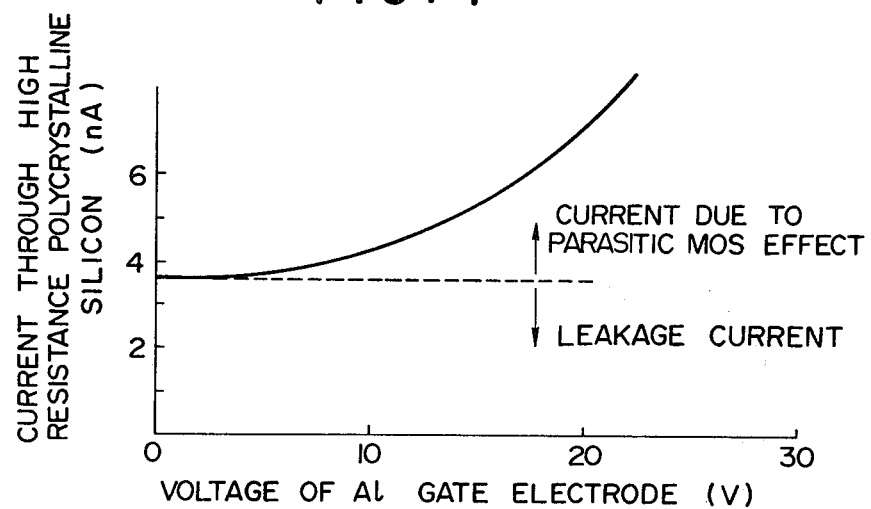
FIG. 7 graphically illustrates influences of provision of an Al metallization layer to electrical characteristics of a Poly Si resistance element A in the structure shown in FIG. 6.
Figure 8:
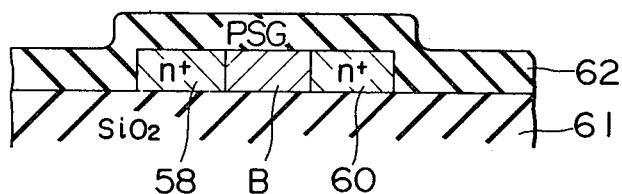
FIG. 8 is a sectional view of a resistance part or element B shown in FIG. 5.
Figure 10:
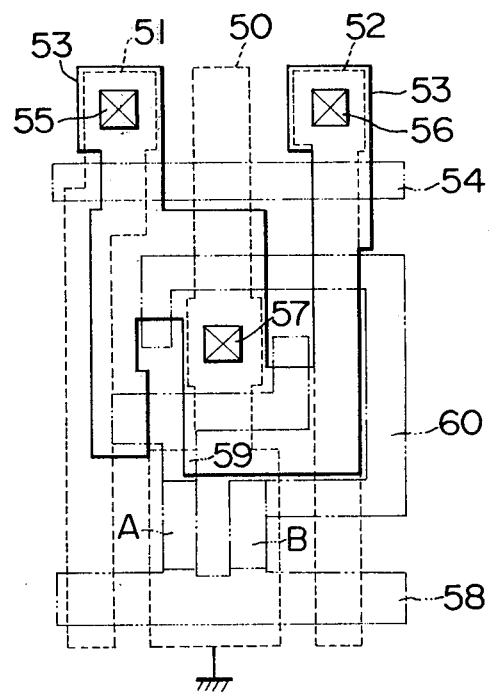
FIG. 10 is a plan view showing a structural pattern of a memory cell according to a first embodiment of the invention.

Referring to FIG. 10 which shows in a top plan view a structural pattern of a memory cell having a circuit configuration shown in FIG. 1 and including high resistance Poly Si parts which are covered by Al electrodes of the earth potential. No parasitic channel is produced to the high resistance Poly Si parts A and B because these parts A and B are covered by Al electrode 50 grounded to earth. Further, electrical influence of Si$_3$N$_4$ film deposited on the Al electrode by a plasma method is inhibited from being exerted to the high resistance Poly Si parts through the shielding action of the grounded Al electrode. In this manner, there can be implemented a static memory cell device incorporating the high resistance Poly Si parts which is stable in respect of structure and operation.

Figure 11A:
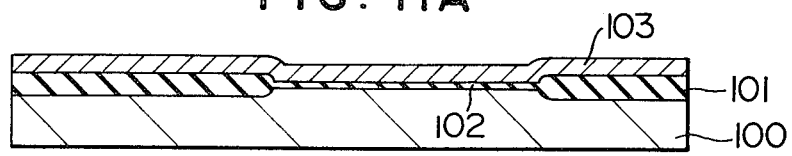
FIGS. 11A, 11B, 11C, 11D, 11E and 11F show sectional views to illustrate fabrication steps of the memory cell according to the first embodiment of the invention.
Figure 11B:
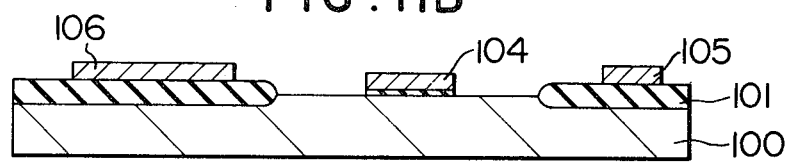
Figure 11C:
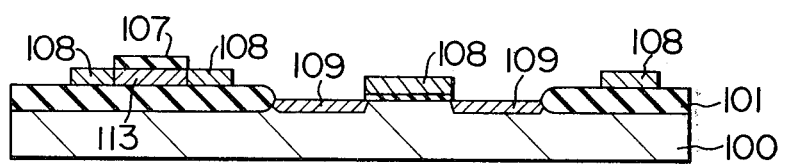
Figure 11D:
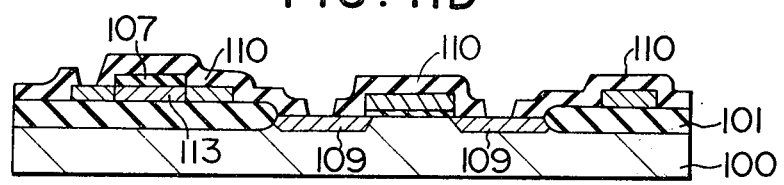
Figure 11E:
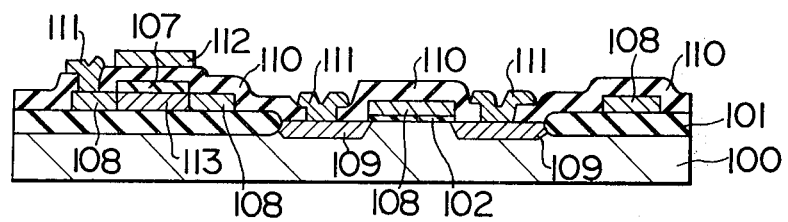
Figure 11F:
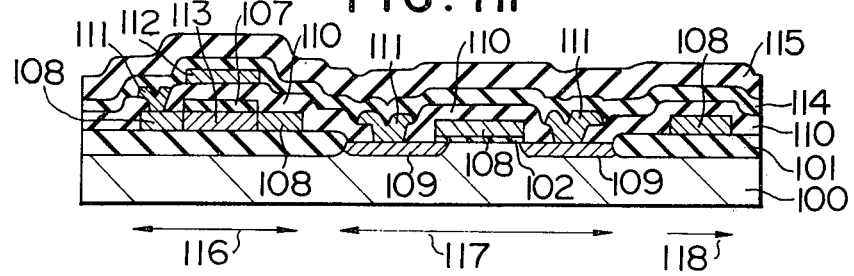

A fabrication process of a memory cell device according to an embodiment of the invention is illustrated in FIGS. 11A to 11F. At first, an oxide film 101 about 10 μm thick is formed on the surface of a Si substrate 100 by a local or selective oxidation process. Subsequently, after a gate oxide film 102 of about 50 to 100 nm thickness having been formed on the substrate surface at an active element region, a high resistance Poly Si film 103 is grown in thickness of about 30 to 50 nm over the whole surface of the wafer (FIG. 11A). Next, Poly Si region 104 which is destined to constitute a gate electrode, a wiring layer 105 and Poly Si region constituting resistances 106 are formed by a photo-etching method (FIG. 11B). Thereafter, SiO$_2$ films 107 of a thickness greater than 100 nm are formed only on the regions destined for the high resistance Poly Si parts or layers. Subsequently, impurity is doped with a high impurity concentration into the Poly Si regions 104, 105 and 106 and the Si substrate 100 by using the SiO$_2$ films 107 as a mask, thereby to form low resistance layers 108 and 109 (FIG. 11C). In this connection, it should be mentioned that impurity may be introduced into the regions which are destined for the low resistance layers preparatively after the Poly Si film have been formed all over the wafer surface, thereby to decrease further the resistance of these regions. Then, PSG films 110 are deposited in thickness of 0.5 to 1.0 μm and the structure is subjected to a thermal process for 10 to 20 minutes at 900° to 1000° C. in the atmosphere of N$_2$ gas, which is followed by formation of contact holes (FIG. 11D). At the next step (FIG. 11E), an Al film is deposited in thickness of 0.8 to 1.0 μm through an evaporation process and then Al electrodes 111 and 112 are formed by a photo-etching method. Thus, the exposed surface of the high resistance Poly Si layer 113 is covered by the Al electrode 112 grounded to earth. Finally, the structure thus formed is annealed at 400° to 500° C. for 30 to 60 minutes in the atmosphere of H$_2$ gas, a PSG film 114 is deposited as a passivation film and then a Si$_3$N$_4$ film 115 is deposited by a plasma method (FIG. 11F).

It is possible to implement a static memory cell device having a high reliability and an enhanced stability by virtue of the structure and the fabrication process described above. By the way, reference numerals 116, 117 and 118 in FIG. 11F designate a resistance region, MOS transistor region and a wiring region, respectively.

Exemplary Embodiment 2

Figure 12:
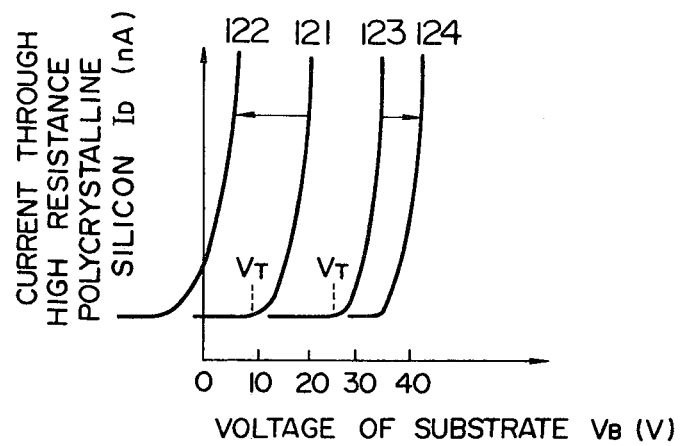
FIG. 12 illustrates graphically electric characteristics of a semiconductor device according to a second embodiment of the invention.

Variation in the resistance value of the Poly Si resistance layer may be evaluated on the basis of threshold voltage $V_T$ and amplification factor $\beta$ of a thin film transistor (parasitic MOS) which is assumed to have a gate constituted by the silicon substrate (potential of which is 0 volt in operation). More specifically, the threshold voltage $V_T$ is shifted in the negative direction while the factor $\beta$ is increased to some degree as the result of the thermal process such as cerdip or glass molding, as illustrated by curves 121 to 124 in FIG. 12.

In this connection, it has been found that deposition of silicon nitride (Si$_3$N$_4$) film by a chemical vapor deposition method (CVD) at the region in the proximity to the high resistance Poly Si resistance layer is very effective for suppressing the variation in the resistance value. Such Si$_3$N$_4$ film may be implemented by making use of a part of the diffusion mask which is employed for protecting the high resistance Poly Si layers when diffusion of impurity at high concentration is effected to the regions of gate, source and drain.

Figure 13:
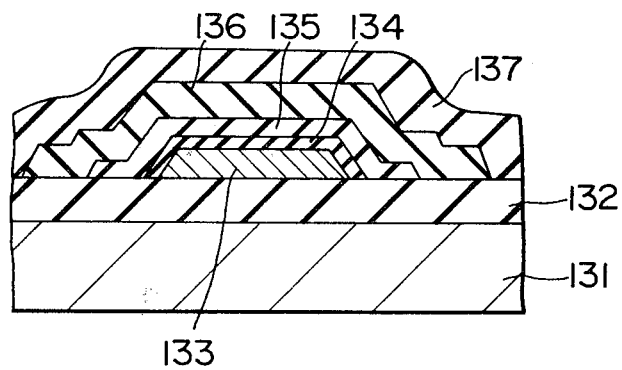
FIGS. 13 and 14 are sectional views showing the semiconductor device according to the second embodiment of the invention.

Referring to FIG. 13, a high resistance Poly Si layer 133 is formed on an insulation layer 132 0.7 to 1.3 μm thick which in turn is formed on a silicon substrate 131. There is usually present around the layer 133 a thermal oxidation film 134 formed as a consequence of the process referred to as a light oxidation process, for example oxidation at 1000° C. for 10 minutes in dry O$_2$ gas. The thickness of the thermal oxide film of SiO$_2$ is in the range of 5 to 100 nm and preferably in the range of 10 to 20 nm. When the thermal oxide film 134 is excessively thin, instability in operation will be involved, while excessively thick thermal oxide film will degrade the intended effectiveness thereof. The upper limit of the thickness should preferably be less than 50 nm. A Si$_3$N$_4$ film 135 is deposited by CVD methods as to surround the high resistance Poly Si layer 133. The thickness of Si$_3$N$_4$ film should be preferably in the range of 30 to 100 nm. In practice, in order to assure a function of a diffusion mask, a silicon oxide film 136 which may contain phosphorus and has a thickness in the range of 0.15 to 0.3 μm is deposited in a laminated manner. It goes without saying that the films 135 and 136 are preferably formed by using the same mask. In a practical device, regions of silicon gate, source and drain are formed through the succeeding high concentration impurity diffusion processes, which is then followed by the process of depositing a second insulation layer 137 and an Al evaporation process, whereby the aimed semiconductor structure is finished.

With the structure of Poly Si resistance described above, the threshold voltage $V_T$ of the parasitic MOS with reference to the potential at the substrate is higher than that of the hitherto known structure by 10 to 20 V. Besides, it has been surprisingly found that the threshold voltage $V_T$ is shifted in the positive direction rather than the negative direction after the thermal treatments such as glass molding, as illustrated by curves 123 and 124 in FIG. 12. Such effect may be explained by the fact that stress induced in the Si$_3$N$_4$ film acts in favorable directions at side portions of the Poly Si layer and that a barrier function is involved against foreign metal ions and hydrogen.

Figure 14:
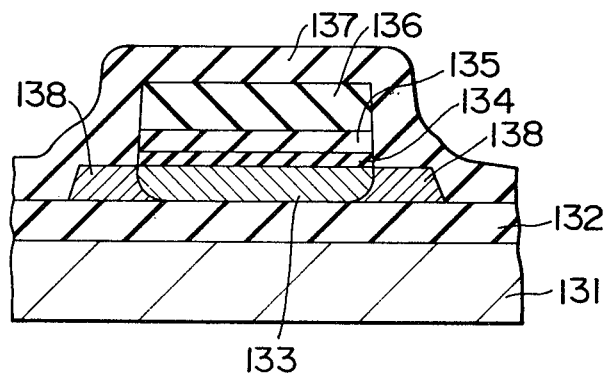

In the case of the exemplary embodiment now being described, it is sufficient that Si$_3$N$_4$ film 135 covers only the low concentration region of the Poly Si layer with the high concentration region 138 (refer to FIG. 14) remaining uncovered except for overlap portions thereof.

The process of fabricating a resistance element of the structure described above is illustrated in FIGS. 15A to 15I. Poly Si layer having a high resistance of $10^9$ to $10^{11}$ Ω/square and a thickness of 30 to 50 nm is deposited on a SiO$_2$ film 151 of about 1 μm thick and a pattern 152 is formed by a photo-etching method (FIG. 15A). A SiO$_2$ film 153 having a thickness of 10 to 20 nm is then formed on the surface of the Poly Si layer pattern at a temperature of 800° to 1000° C. in the atmosphere of O$_2$ gas. Subsequently, a Si$_3$N$_4$ film 154 50 to 100 nm thick is deposited over the Poly Si layer 152 with the SiO$_2$ layer 153 being interposed therebetween by a chemical vapor deposition (CVD) method (FIG. 15B). Further, a SiO$_2$ film 155 200 nm to 300 nm thick is deposited on the Si$_3$N$_4$ film 154 by CVD method (FIG. 15C). Next, a high concentration impurity region (low resistance region) is formed locally in the Poly Si layer 152. To this end, a thermal diffusion method and an ion implantation method can be employed. According to the thermal diffusion method, a pattern of SiO$_2$ film 155 is formed on the Poly Si layer by a photo-etching method to be used as a diffusion mask for selectively or locally removing the Si$_3$N$_4$ film 154 and SiO$_2$ film 153 by a photo-etching method thereby to expose correspondingly the underlying Poly Si layer. Next, an impurity such as phosphorus or boron is introduced heavily at an impurity concentration higher than $10^{14}$ cm$^{-3}$ thereby to form a heavily doped impurity regions 156 (FIG. 15D). Subsequently, a PSG film of 0.5 to 1.0 μm in thickness is deposited by CVD method and contacting holes 150 are formed by a photo-etching method (FIG. 15E).

According to the ion implantation method, impurity ions 158 such as phosphorus or boron ions are implanted into the Poly Si layer at a concentration of $10^{15}$ to $10^{16}$ cm$^{-2}$ thereby to form a heavily doped impurity regions 157 (FIG. 15G). Next, the Si$_3$N$_4$ film 154 is removed by a chemical etching method or a plasma etching method. However, the Si$_3$N$_4$ film underlying the SiO$_2$ film 155 is not removed. Subsequently, a PSG film 159 is deposited and then contacting holes 150 are formed (FIG. 15H). Alternately, the Si$_3$N$_4$ film may be left unremoved and the PSG film 159 may be deposited on the Si$_3$N$_4$ film. In this case, after having formed the contacting holes, the exposed Si$_3$N$_4$ regions may be removed by a chemical etching method or plasma etching method. In succession to the formation of the contacting holes in PSG film, Al electrodes 160 having a thickness of 0.8 to 1.0 μm are formed, which is followed by deposition of a PSG film 161 of 0.1 to 0.5 μm thick serving as a passivation or protection layer. Finally, a Si$_3$N$_4$ film 162 is deposited on the PSG film to a thickness of 1.0 to 2.0 μm (FIGS. 15F and 15I).

Figure 16:
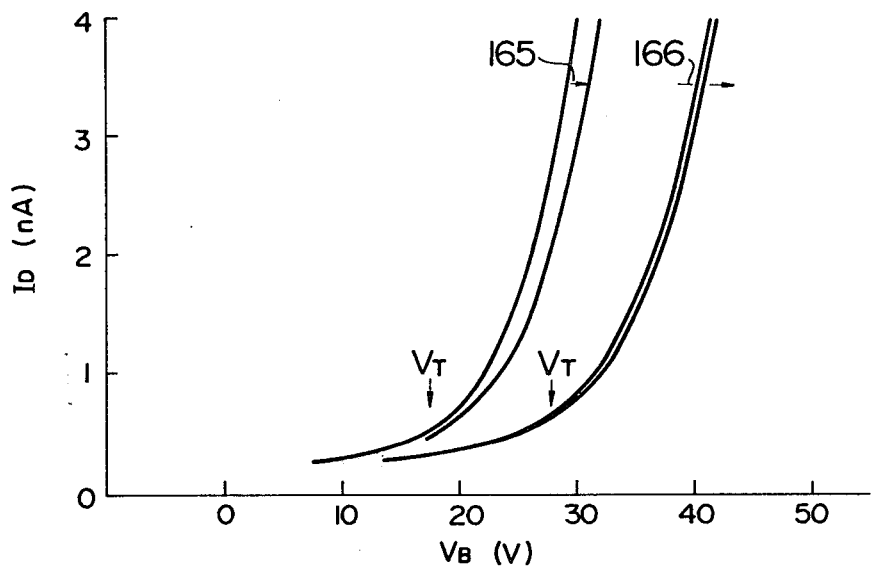
FIGS. 16 and 17 are graphs to illustrate electric characteristics of the device according to the second embodiment of the invention.
Figure 17:
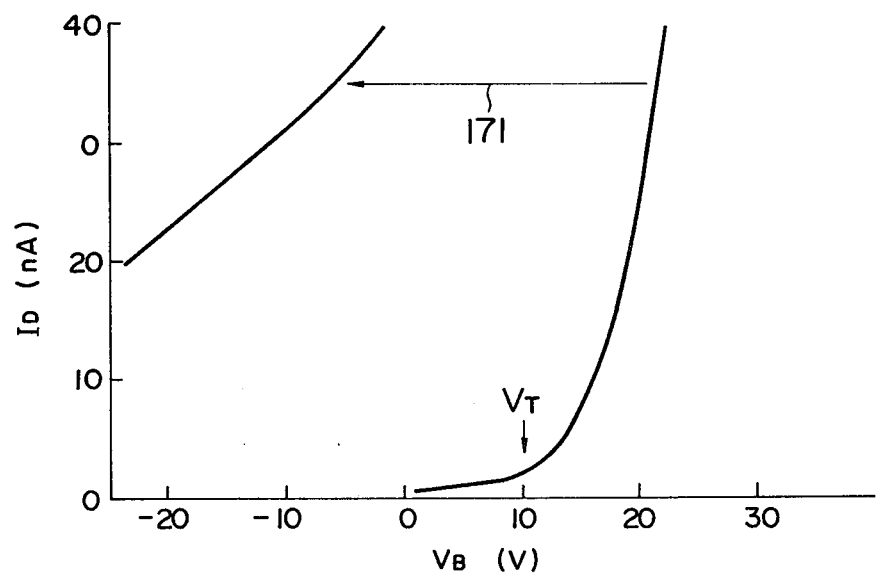

Referring to FIGS. 16 and 17, arrows 165, 166 and 171 represent change or shift of an electrical characteristic of the parasitic MOS due to annealing in the air at 400° C. for 12 minutes. The shift of the characteristic curve 166 corresponds to the structure in which the Si$_3$N$_4$ film is formed by CVD method. The shift of the characteristic curve 166 is brought about as the result of the formation of the Si$_3$N$_4$ film by CVD method in combination with the Al shield electrode (of zero potential) described in conjunction with the preceding exemplary embodiment, while the shift 171 took place in the structure in which neither the Si$_3$N$_4$ film nor the shielding Al electrode is formed.

Exemplary Embodiment 3

Figure 18:
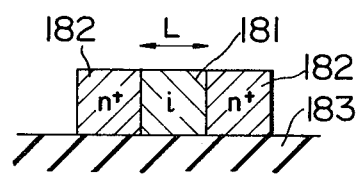
FIG. 18 is a sectional view of a Poly Si resistance element of $n^+$-i-$n^+$ structure.
Figure 19:
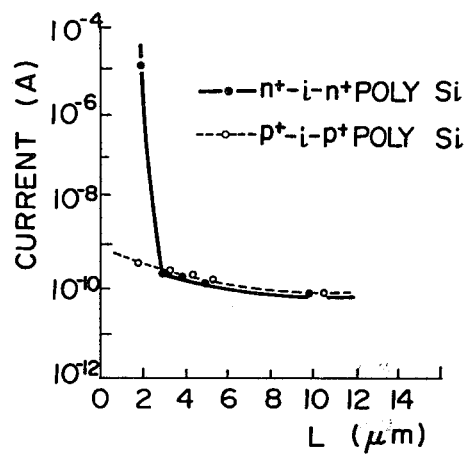
FIG. 19 graphically illustrates variation of current through a Poly Si resistance element as a function of length thereof.

FIG. 18 illustrates schematically a sectional structure of a polycrystalline silicon or Poly Si resistance in a hitherto known static memory cell in which n-channel MOS transistors are used. At both sides of a Poly Si region 181 having a high resistance, there are formed low resistance Poly Si regions 182 doped with impurity of n-type conductivity such as phosphorus (P) or arsenic (As). In FIG. 19 a solid curve represents the small current characteristic of the high resistance Poly Si region shown in FIG. 18 as a function of the length L thereof. As can be seen from FIG. 19, an extremely large current will be produced due to the punch-through phenomenon when the length L of the high resistance region becomes shorter, resulting in a corresponding increase of the power dissipation which is a disadvantage. It has been found that the design length of the high resistance region should preferably be longer than 3 μm in the structure shown in FIG. 18 in which the n-type regions of high impurity concentration are formed by the ion implantation process. On the other hand, when Al electrode is formed on the high resistance region of the structure shown in FIG. 18 with PSG film being interposed therebetween, the current characteristic of the high resistance Poly Si region varies as a function of voltage $V_G$ at the Al electrode in a manner illustrated by a solid curve in FIG. 20. As can be seen from this figure, when a voltage higher than several volts is applied to the high resistance region by way of the PSG film, the current flowing through the high resistance region is disadvantageously increased due to a kind of the parasitic MOS effect. This means in turn that the current flowing through the high resistance region will vary even when a polarized insulation film such as Si$_3$N$_4$ is present on the high resistance region.

With the invention, it is also envisaged to eliminate the disadvantages of the hitherto known structure described above and provide an improved static memory cell incorporating the high resistance Poly Si regions of an enhanced stability at a high integration density. To this end, the invention teaches a structure in which the high resistance Poly Si layer is heavily doped with p-type impurity such as boron (B) at both end regions thereof.

Figure 21A:
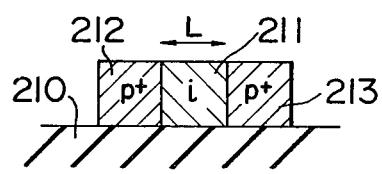
FIGS. 21A and 21B are sectional views showing a semiconductor structure according to a third embodiment of the invention.
Figure 21B:
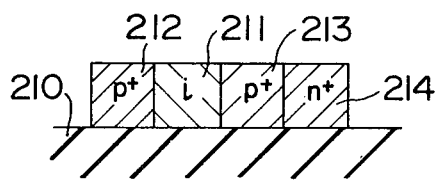

More specifically, referring to FIGS. 21A and 21B which show in sectional views structures of polycrystalline silicon or Poly Si resistance according to the invention, there are formed at both sides of a high resistance region 211 the regions 212 and 213 which are heavily doped with a p-type impurity such as boron at a concentration not smaller than $10^{19}$ cm$^{-3}$. In the case of the structure shown in FIG. 21A, electrical connection of the semiconductor substrate underlying an insulation film 210 to the diffusion layer of p-type conductivity can be accomplished by contacting the heavily doped p-type layer of the Poly Si resistance structure directly to the p-type diffusion layer. However, an Al-metallized wire has to be employed for the connection to the n-type diffusion layer. In the case of the structure shown in FIG. 21B, there is formed a heavily doped n-type layer 214 having an impurity concentration not smaller than $10^{19}$ cm$^{-3}$ in contiguity to the heavily doped p-type layer 213 which is formed at one end region of the Poly Si resistance layer. In this structure, since the junction formed between the heavily doped n-type layer 214 and the heavily doped p-type layer 213 exhibits a very low resistance, the combined resistance of the whole structure is determined primarily by the resistance of the high resistance region 211. Further, this structure allows the n-type layer 214 to be directly connected to the n-type diffusion layer.

Figure 20:
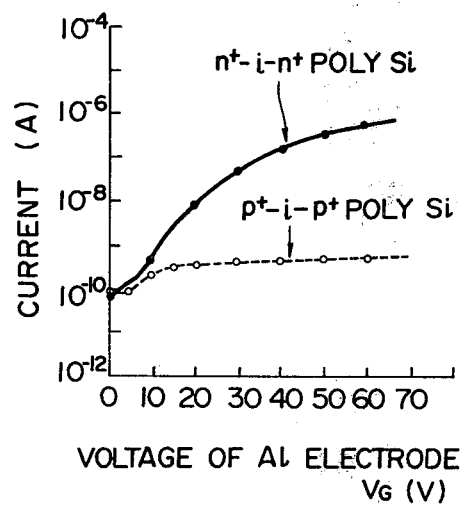
FIG. 20 graphically illustrates parasitic MOS effects of Poly Si resistances.

Again referring to FIG. 19, a broken curve represents the current characteristic of the Poly Si resistance structure according to the invention as a function of the length L of the high resistance region. As can be seen from the figure, no current increase due to the punch-through phenomenon will take place even at the design length L of 2 μm when the heavily doped p-type layer or region is formed by an ion implantation method, which means that the high resistance region can be designed at a short length L and thus the static memory cell incorporating the Poly Si resistances can be implemented at a high integration density, thereby to facilitate manufacture of large scale integrated devices. In FIG. 20, a broken curve represents a current characteristic of the high resistance Poly Si region of the structure according to the invention as a function of the voltage $V_G$ applied to the Al electrode formed on the high resistance Poly Si region with a PSG film being interposed therebetween. As can be seen from this figure, no current increase due to the parasitic MOS effect will take place even when a positive voltage is applied to the Al electrode. In this manner, a static memory cell exhibiting an excellent stability can be attained without resorting to the use of a polarized insulation film such as $Si_3N_4$.

Figure 22A:
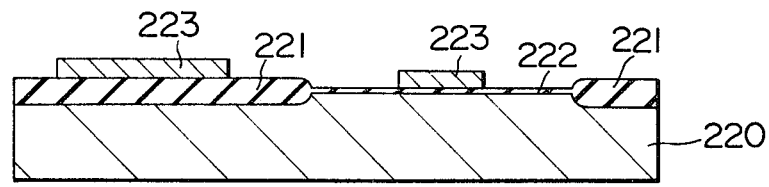
FIGS. 22A, 22B, 22C and 22D are sectional views to illustrate fabrication steps of the structure according to the third embodiment of the invention.
Figure 22B:
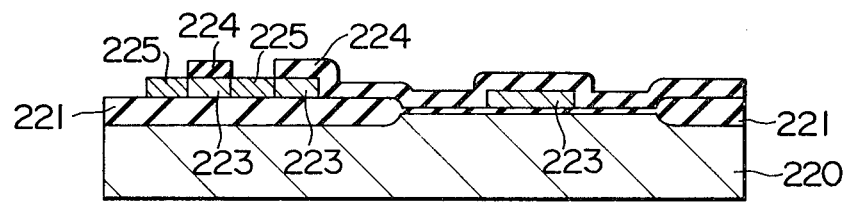
Figure 22C:
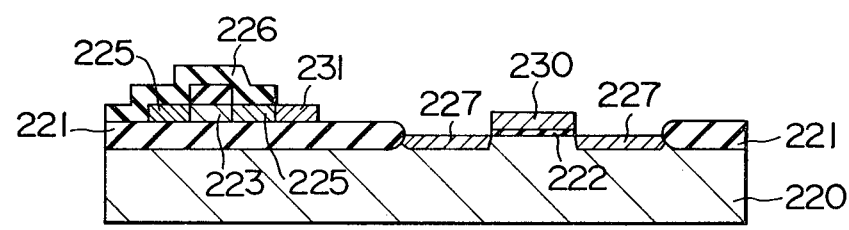
Figure 22D:
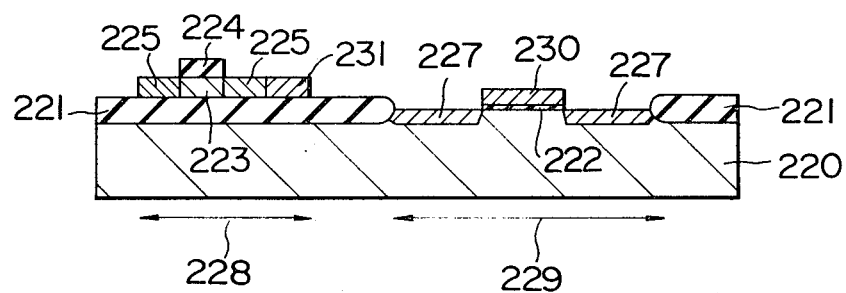

FIGS. 22A to 22D show fabrication steps of a Poly Si resistance structure according to the embodiment of the invention described above. In the first place, a $SiO_2$ film 221 about 1 μm thick is formed on a Si substrate 220 in an isolation region by a local oxidation process. Subsequently, a thin oxide gate film 222 50 to 100 nm thick is formed. Additionally, a Poly Si layer 223 having a high resistivity of $10^8$ to $10^{11}$ Ω/square is deposited at a thickness of 0.3 to 0.5 μm on the wafer surface by CVD method and thereafter a desired pattern including the high resistance layer, gate electrode, metallization layer and so forth is formed by a photo-etching method (FIG. 22A). Subsequently, a $SiO_2$ film 224 is deposited at a thickness of about 0.3 μm by CVD method. The $SiO_2$ film 224 is then removed by a photo-etching process only at the region in which a heavily doped p-type layer is to be formed. The heavily doped p-type layer 225 is then formed by doping the exposed region with boron, a p-type impurity, at a concentration higher than $10^{19}$ cm$^{-3}$ by a thermal diffusion process or ion implantation process (FIG. 22B). Next, a $SiO_2$ film 226 is again deposited at a thickness of about 0.3 μm by CVD method, which film 226 is then removed by a photo-etching process only at the regions where heavily doped n-type layers are to be formed. The heavily doped n-type layers 227, 230 and 231 are formed by doping the exposed regions with n-type impurity such as phosphorus or arsenic at a high concentration of about $10^{20}$ cm$^{-3}$ (FIG. 22C). Subsequently, the $SiO_2$ film 226 deposited by CVD process is removed about 0.3 μm thick by a chemical etching process (FIG. 22D). In FIG. 22D, numeral 228 denotes the resistance region of Poly Si in which the high resistance Poly Si layer is denoted by 223. Further, reference numeral 229 denotes MOS transistor region having a gate electrode 230, a source and a drain region designated by 227.

A grounded Al electrode 112 may be formed on the high resistance Poly Si layer in the manner described hereinbefore in conjunction with FIGS. 11D to 11F.

Further, a $Si_3N_4$ film may be formed on the high resistance Poly Si layer 223 by CVD method in the manner described hereinbefore in conjunction with the exemplary embodiment 2. Additionally, the grounded Al electrode may be equally provided.

We claim:

1. A semiconductor device comprising at least a resistance element including a resistance part formed of polycrystalline silicon of a high resistance and p-type conductivity terminal parts formed of polycrystalline silicon of a low resistance at both end portions of said resistance part, wherein a metal electrode is provided above said resistance part with an insulation layer being interposed therebetween, said electrode being coupled to a predetermined potential, wherein said insulation layer includes a first film containing silicon dioxide as a main component and a second film formed of silicon nitride on said first film through chemical vapor deposition, said first film having a thickness in the range of 5 to 100 nm, and said second film having a thickness in the range of 30 to 100 nm.

2. A semiconductor device comprising at least a resistance element including a resistance part formed of polycrystalline silicon of a high resistance and p-type conductivity terminal parts formed of polycrystalline silicon of a low resistance at both end portions of said resistance part, and an electrode provided above said resistance part, wherein said semiconductor device further includes means for suppressing the formation of a parasitic MOS device under the resistance part of said polycrystalline silicon and for raising the threshold voltage of any such parasitic MOS device which is formed, said means comprising coupling means for coupling said electrode to a predetermined potential, and an insulation layer interposed between said metal electrode and said resistance part including a first film containing silicon dioxide as a main component and a second film formed of silicon nitride on said first film through chemical vapor deposition.

3. A semiconductor device according to claim 1 or 2, wherein at least one of said terminal parts is provided with a contact part formed of n-type polycrystalline silicon of a low resistivity.

4. A semiconductor device according to claim 1 or 2, wherein said resistance element constitutes a load resistance of a memory circuit, while said electrode constitutes a grounded electrode of said memory circuit.

5. A semiconductor device according to claim 2, wherein said first film has a thickness in the range of 5 to 100 nm.

6. A semiconductor device according to claim 2 or 5, wherein said second film has a thickness in the range of 30 to 100 nm.

7. A semiconductor device according to claim 2, wherein said electrode is a metal electrode.

8. A semiconductor device according to claim 1 or 2, wherein said predetermined potential is ground.

* * * * *